(12) United States Patent
Ok et al.

(10) Patent No.: US 11,456,415 B2
(45) Date of Patent: Sep. 27, 2022

(54) PHASE CHANGE MEMORY CELL WITH A WRAP AROUND AND RING TYPE OF ELECTRODE CONTACT AND A PROJECTION LINER

(71) Applicant: INTERNATIONAL BUSINESS MACHINES CORPORATION, Armonk, NY (US)

(72) Inventors: Injo Ok, Loudonville, NY (US); Ruqiang Bao, Niskayuna, NY (US); Andrew Herbert Simon, Fishkill, NY (US); Kevin W. Brew, Niskayuna, NY (US); Nicole Saulnier, Slingerlands, NY (US); Iqbal Rashid Saraf, Glenmont, NY (US); Muthumanickam Sankarapandian, Niskayuna, NY (US); Sanjay C. Mehta, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 142 days.

(21) Appl. No.: 17/114,594

(22) Filed: Dec. 8, 2020

(65) Prior Publication Data
US 2022/0181546 A1    Jun. 9, 2022

(51) Int. Cl.
    *H01L 45/00*          (2006.01)
    *H01L 27/24*          (2006.01)

(52) U.S. Cl.
    CPC ........ *H01L 45/126* (2013.01); *H01L 27/2463* (2013.01); *H01L 45/06* (2013.01); *H01L 45/1233* (2013.01); *H01L 45/16* (2013.01)

(58) Field of Classification Search
CPC ..................................................... H01L 45/00
See application file for complete search history.

(56) References Cited

U.S. PATENT DOCUMENTS

| | | |
|---|---|---|
| 5,536,947 A | 7/1996 | Klersy |
| 8,144,508 B2 | 3/2012 | Franceschini |
| | (Continued) | |

FOREIGN PATENT DOCUMENTS

| | | |
|---|---|---|
| CN | 1702883 A | 11/2005 |
| CN | 1892889 A | 1/2007 |
| | (Continued) | |

OTHER PUBLICATIONS

Ding et al., "Phase-change heterostructure enables ultralow noise and drift for memory operation", Phase-Change Memory, Research, Science, 366, pp. 210-215, Oct. 11, 2019.

(Continued)

*Primary Examiner* — Marvin Payen
(74) *Attorney, Agent, or Firm* — L. Jeffrey Kelly

(57) ABSTRACT

A semiconductor structure may include a heater surrounded by a dielectric layer, a projection liner on top of the heater, a phase change material layer above the projection liner, and a top electrode contact surrounding a top portion of the phase change material layer, The projection liner may cover a top surface of the heater. The projection liner may separate the phase change material layer from the second dielectric layer and the heater. The projection liner may provide a parallel conduction path in the crystalline phase and the amorphous phase of the phase change material layer. The top electrode contact may be separated from the phase change material layer by a metal liner. The semiconductor structure may include a bottom electrode below and in electrical contact with the heater and a top electrode above and in electrical contact with the phase change material layer.

20 Claims, 7 Drawing Sheets

SECTION X - X

(56) References Cited

U.S. PATENT DOCUMENTS

| | | |
|---|---|---|
| 8,809,829 B2 | 8/2014 | Lee |
| 9,059,404 B2 | 6/2015 | Brightsky |
| 9,246,093 B2 | 1/2016 | Zanderighi |
| 9,257,639 B2 | 2/2016 | Kim |
| 9,293,199 B2 | 3/2016 | Krebs |
| 9,530,493 B2 | 12/2016 | Eleftheriou |
| 9,570,169 B1 | 2/2017 | Czornomaz |
| 9,666,273 B2 | 5/2017 | Papandreou |
| 10,395,732 B2 | 8/2019 | Czornomaz |
| 10,573,811 B2 | 2/2020 | Tseng |
| 2003/0209746 A1 | 11/2003 | Horii |
| 2009/0236583 A1 | 9/2009 | Kuo et al. |
| 2012/0048768 A1 | 3/2012 | Holloway |
| 2013/0336047 A1 | 12/2013 | Hokenmaier |
| 2014/0369113 A1 | 12/2014 | Krebs et al. |
| 2014/0369114 A1 | 12/2014 | Kim et al. |
| 2018/0040817 A1 | 2/2018 | Chuang et al. |
| 2019/0140171 A1 | 5/2019 | BrightSky et al. |
| 2019/0148637 A1 | 5/2019 | Ando |
| 2020/0091427 A1 | 3/2020 | Ando |
| 2020/0381618 A1 | 12/2020 | Cappelletti |
| 2021/0091307 A1 | 3/2021 | BrightSky et al. |

FOREIGN PATENT DOCUMENTS

| | | |
|---|---|---|
| CN | 106206938 A | 12/2016 |
| EP | 2034536 A1 | 3/2009 |
| EP | 2034536 B1 | 11/2010 |
| TW | 200744205 A | 1/2007 |

OTHER PUBLICATIONS

Koelmans et al., "Projected phase-change memory devices", nature Communications, Article, Received May 18, 2015, Accepted Jul. 27, 2015, Published Sep. 3, 2015, pp. 1-7.

Li et al., "Understanding phase-change materials with unexpectedly low resistance drift for phase-change memories", Journal of Materials Chemistry C, Issue 13, 2018, 6 pages, Accessed on Jul. 14, 2020.

Sarwat, "Materials science and engineering of phase change random access memory", Materials Science and Technology, vol. 33, No. 16, Published online Jul. 18, 2017, 1890-1906.

Sebastian et al., "Computational phase-change memory: beyond von Neumann computing", Journal of Physics D: Applied Physics, 52 (2019), Published Aug. 20, 2019, pp. 1-14.

Notification of Transmittal of the International Search Report and the Written Opinion of the International Searching Authority, or the Declaration, dated Mar. 2, 2022, International application No. PCT/IB2021/060700, 12 pages.

IBM: List of IBM Patents or Patent Applications Treated as Related (Appendix P), Dec. 22, 2020, 2 pages.

Pending U.S. Appl. No. 17/114,605, filed Dec. 8, 2020, entitled: "Phase Change Memory Cell With a Projection Liner", 34 pages.

Notification of Transmittal of the International Search Report and the Written Opinion of the International Searching Authority, or the Declaration, dated Mar. 2, 2022, International application No. PCT/IB2021/060692, 11 pages.

PHASE CHANGE MEMORY CELL WITH A WRAP AROUND AND RING TYPE OF ELECTRODE CONTACT AND A PROJECTION LINER

BACKGROUND

The present invention relates generally to a phase change memory cell, and more particularly, to a method and structure for forming a phase change memory cell with a wrap around and ring type of electrode contact and a projection liner.

A phase change memory cell may be used for data storage. The phase change memory cell is a non-volatile random-access memory. A typical configuration of a phase change memory cell may include a phase change material arranged between, and coupled to, at least two electrodes. When the phase change memory cell is in use, the phase change material may be operated in one of at least two reversibly transformable phases, an amorphous phase, and a crystalline phase. The amorphous phase and the crystalline phase are distinct from one another. In the amorphous phase, the phase change material has a discernibly higher resistance when compared to the crystalline phase. In order to facilitate a phase transition, energy is supplied to the phase change material such as, for example, electrical energy, thermal energy, any other suitable form of energy or combination thereof that may effectuate a desired phase transition.

To facilitate a change from the crystalline phase to the amorphous phase, an electrical energy such as a voltage pulse, may be applied to one of the electrodes, for example a bottom electrode, causing the phase change material at the electrode, or substantially in the vicinity thereof, to heat above its melting temperature. The phase change material is then rapidly cooled below its glass temperature. The phase change material that is treated in this way is transformed from the crystalline phase to the amorphous phase. An amorphized area is created in the phase change material where such a phase transition has occurred.

SUMMARY

According to one embodiment of the present invention, a semiconductor structure is provided. The semiconductor structure may include a heater surrounded by a dielectric layer, a projection liner on top of the heater, a phase change material layer above the projection liner, and a top electrode contact surrounding a top portion of the phase change material layer. The projection liner may cover a top surface of the heater. The projection liner may separate the phase change material layer from the second dielectric layer and the heater. The projection liner may provide a parallel conduction path in the crystalline phase and the amorphous phase of the phase change material layer. The top electrode contact may be separated from the phase change material layer by a metal liner. The top electrode contact may be a wrap-around ring type of top electrode contact that may vertically extend along the sidewalls of the phase change material layer. The semiconductor structure may include a bottom electrode below and in electrical contact with the heater and a top electrode above and in electrical contact with the phase change material layer. The semiconductor structure may include a mask layer above and in direct contact with the top electrode and a bottom electrode contact below and in electrical contact with the bottom electrode. The phase change material layer may include a crystalline phase and an amorphous phase. The amorphous phase may be directly above the heater. The semiconductor structure may also include a first metal layer below and in electrical contact with the bottom electrode contact, a second metal layer above and in electrical contact with the top electrode contact, and a via contact between and in electrical contact with the first metal layer and the second metal layer.

According to another embodiment of the present invention, a semiconductor structure is provided. The semiconductor structure may include two or more phase change memory cells separated by a dielectric layer. Each of the two or more phase change memory cells may include a phase change material layer and a heater. The semiconductor structure may include two or more top electrode contacts on top of the two or more phase change memory cells. The two or more top electrode contacts may be separated from the phase change memory cells by a metal liner. The two or more top electrode contacts may be wrap-around ring type of top electrode contacts that may vertically extend along the sidewalls of the phase change material layer. The two or more top electrode contacts may extend vertically along sidewall portions of the phase change material layer. The phase change material layer may include a crystalline phase and an amorphous phase. The amorphous phase may be directly above the heater. The two or more phase change memory cells may include the heater surrounded by a second dielectric layer, a projection liner on top of the heater, the phase change material layer above the projection liner, a bottom electrode below and in electrical contact with the heater, and a top electrode above and in electrical contact with the phase change material layer. The projection liner may cover a top surface of the heater. The projection liner may separate the phase change material layer from the second dielectric layer and the heater. The projection liner may provide a parallel conduction path in the crystalline phase and the amorphous phase of the phase change material layer. The semiconductor structure may include a mask layer above and in direct contact with the top electrode and a bottom electrode contact below and in electrical contact with the bottom electrode. The semiconductor structure may also include a first metal layer below and in electrical contact with the bottom electrode contact, a second metal layer above and in electrical contact with the top electrode contact, and a via contact between and in electrical contact with the first metal layer and the second metal layer.

According to another embodiment of the present invention, a method is provided. The method may include forming a heater surrounded by a second dielectric layer, depositing a projection liner on top of the heater, depositing a phase change material layer above the projection liner, and forming a top electrode contact surrounding a top portion of the phase change material layer. The phase change material layer may include a crystalline phase and an amorphous phase. The amorphous phase may be directly above the heater. The projection liner may cover a top surface of the heater. The projection liner may separate the phase change material layer from the second dielectric layer and the heater. The projection liner may provide a parallel conduction path in the crystalline phase and the amorphous phase of the phase change material layer. The top electrode contact may be separated from the phase change material layer by a metal liner. The top electrode contact may be a wrap-around ring type of top electrode contact that may vertically extend along the sidewalls of the phase change material layer. The method may include forming a bottom electrode below and in electrical contact with the heater, and depositing a top electrode above and in electrical contact with the phase change material layer. The method may include depositing a mask layer above and in direct contact with the top electrode and forming a bottom electrode contact below and in electrical contact with the bottom electrode.

BRIEF DESCRIPTION OF THE DRAWINGS

The following detailed description, given by way of example and not intend to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
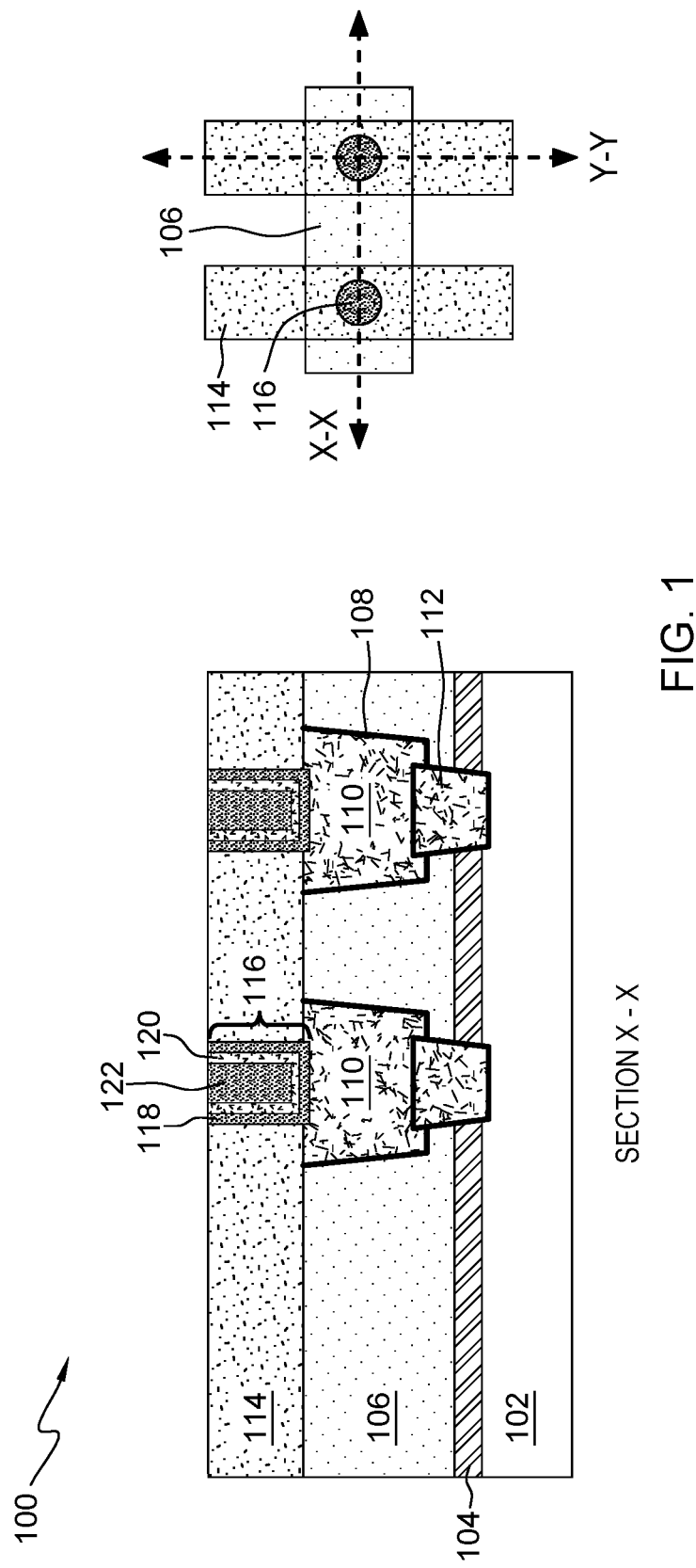
FIG. 1 is a cross section view illustrating heaters within a second dielectric layer according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiment set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

When the phase change memory cell is in use, the phase change material may be operated in one of at least two reversibly transformable phases, an amorphous phase, and a crystalline phase. The amorphous and crystalline phases may also be referred to as the amorphous and crystalline states. The amorphous state of the phase change material has high resistance and low conductance whereas the crystalline state of the phase change material has low resistance and high conductance. The amorphous and crystalline states may be used to program different data values within a phase change memory cell.

The programming of different data values within a phase change memory cell may be accomplished by using electrodes, such as, for example, a bottom electrode and a top electrode, to supply appropriate voltages to the phase change material. Depending on the applied voltage, the phase change material goes from either the crystalline state to the amorphous state, or vice versa. Further, a phase change memory cell may have different programming levels. Each programming level may correspond with a different voltage that was applied to the phase change material to program it. Once the phase change memory cell is programmed, a read voltage may be applied, using the electrodes, to retrieve information stored at that phase change material level. The read voltage may be sufficiently low to ensure that application of the read voltage does not disturb the programmed cell state.

However, once the phase change memory cell is programmed, the resistance of the phase change memory cell may exhibit or experience resistance drift. More particularly, it is the amorphous state that may exhibit the resistance drift. That is, the resistance of a phase change memory cell in an amorphous state may increase over time. The resistance of the phase change memory cell is unpredictable due to the resistance drift. Therefore, it would be advantageous to mitigate resistance drift, thus making the resistance of the phase change material predictable and repeatable. Further, mitigating resistance drift allows for the phase change memory cell to have resistance that may change linearly with the applied programming pulses.

To mitigate resistance drift without compromising any attributes of the phase change memory cell, embodiments of the present invention provide a phase change memory cell structure with a wrap around and ring type electrode contact and a projection liner, and a method of forming the structure.

Figure 2:
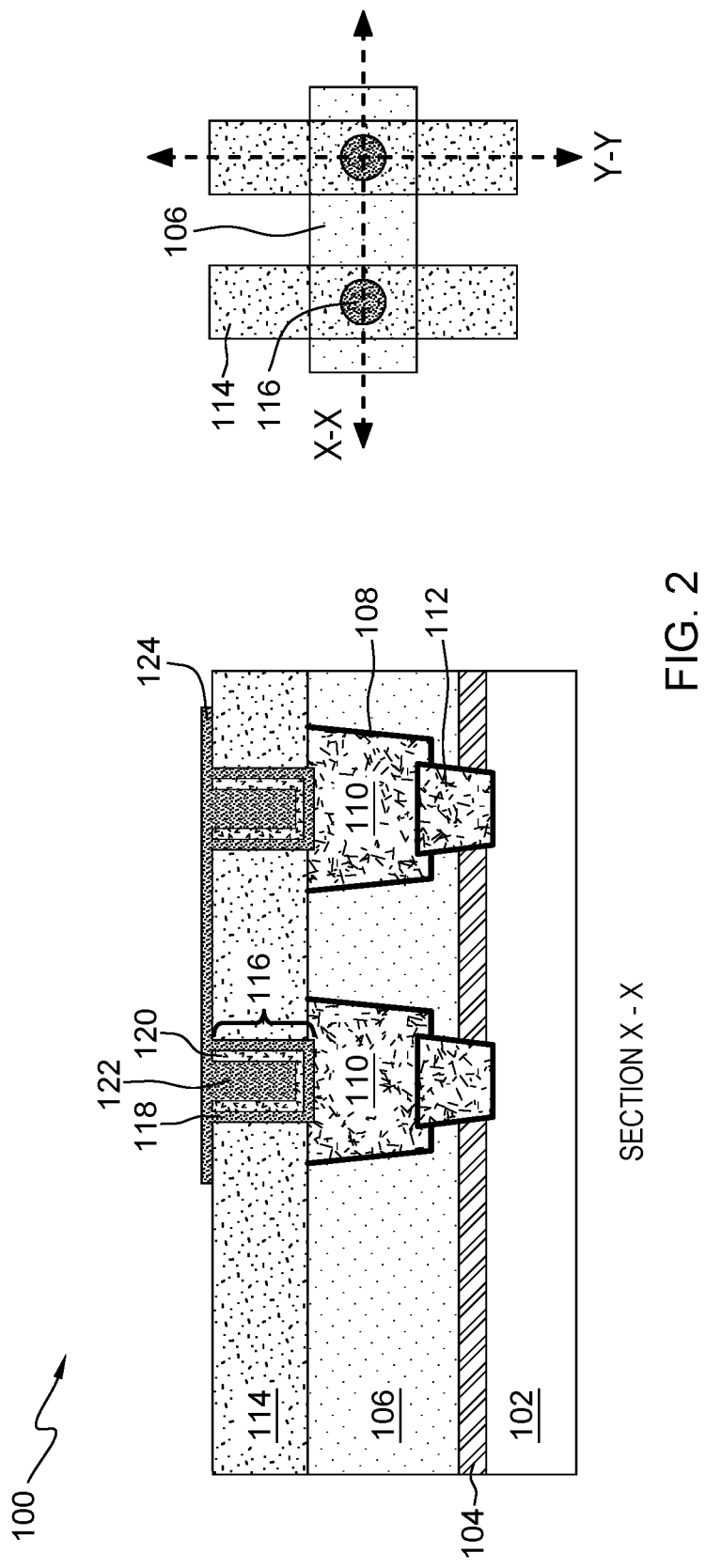
FIG. 2 is a cross section view illustrating a projection liner above the heaters according to an exemplary embodiment.
Figure 3:
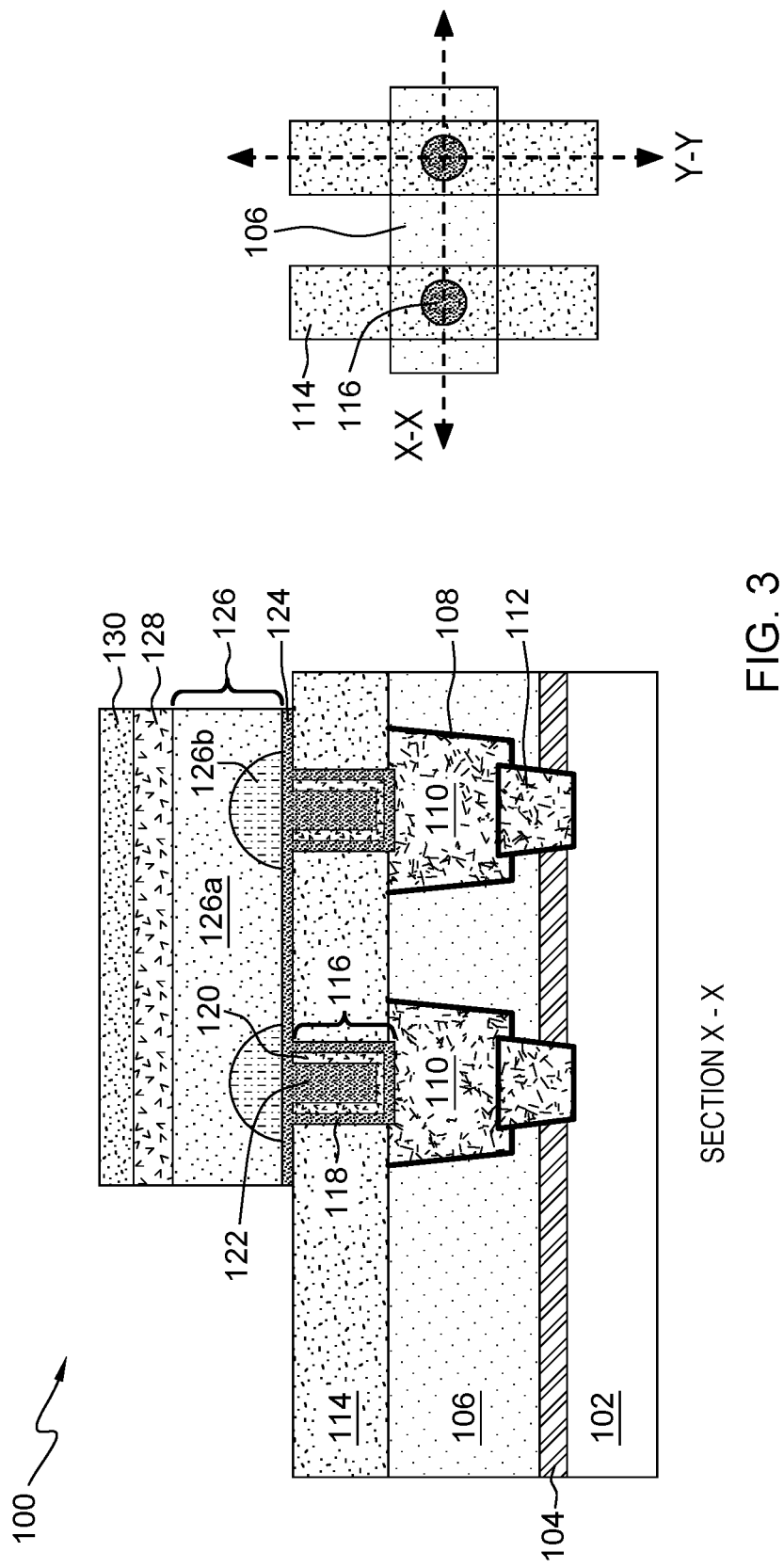
FIG. 3 is a cross section view illustrating a phase change material layer, a top electrode, and a mask layer above the heaters according to an exemplary embodiment.
Figure 4:
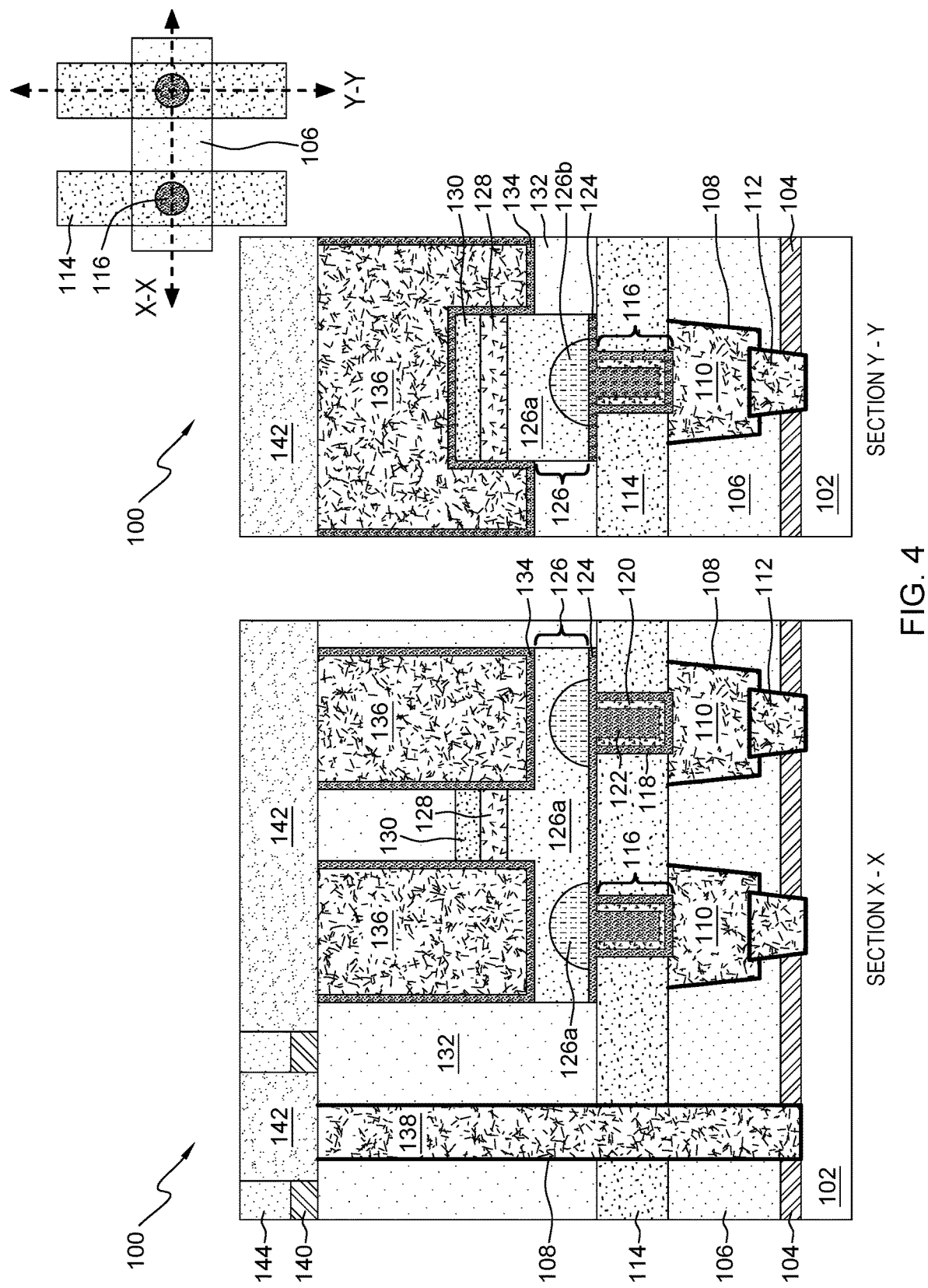
FIG. 4 is a cross section view, along sections X-X and Y-Y, illustrating top electrode contacts with a metal liner and a via contact according to an exemplary embodiment.

FIGS. 1-4 illustrate exemplary method steps of forming a phase change memory cell with a wrap around, ring type electrode contact and a projection liner, in accordance with an embodiment. FIGS. 1-3 are cross section views taken along section line X-X. FIG. 4 is a cross section view taken along section line X-X and section Y-Y.

Referring now to FIG. 1, a structure 100 is shown, in accordance with an embodiment. The structure 100 may include a metal layer 102, an NBLOK 104, a first dielectric layer 106, a barrier layer 108, bottom electrodes 110, bottom electrode contacts 112, a second dielectric layer 114, and a heater 116. The metal layer 102 may be made of metal, such as, for example copper. The metal layer 102 may be referred to as the first metal layer. The NBLOK 104 is a barrier film used in copper chips. The NBLOK 104 may be made of nitrogen doped silicon carbide or carbon doped silicon nitride. The NBLOK 104 may be formed on the metal layer 102 using standard deposition methods. The NBLOK 104 may be referred to as the first NBLOK.

The first dielectric layer 106 may be deposited on a top surface of the NBLOK 104 using known deposition techniques, such as, for example, atomic layer deposition (ALD), chemical vapor deposition (CVD), or physical vapor deposition (PVD). The first dielectric layer 106 may be made of any suitable low-k dielectric material, TEOS, or a bi-layer of TEOS and NBLOK. The bottom electrodes 110 may be formed within a trench in the first dielectric layer 106. Once the trench (now shown) is formed, the barrier layer 108 may be conformally deposited using known deposition techniques, such as, for example, ALD. The barrier layer 108 may be made of tantalum nitride (TaN), titanium nitride (TiN), or any combination thereof. The barrier layer 108 prevents the material, forming the bottom electrode 110, from migrating into the first dielectric layer 106. The trench is then filled with a conductive material, such as, for example, copper, tungsten, cobalt, or aluminum, forming the bottom electrode 110. A planarization process, such as, for example, chemical mechanical polishing (CMP), is done to remove excess material from a top surface of the structure 100.

In addition to the bottom electrodes 110, the structure includes the bottom electrode contacts 112. The bottom electrode contacts 112 may be formed using standard deposition and lithography methods. The bottom electrode contacts 112 may be made of conductive metals such as, for example, copper, tungsten, cobalt, or aluminum, to allow for current to pass through the bottom electrodes 110 and the bottom electrode contacts 112. The bottom electrode contacts 112 are below and in electrical contact with the bottom electrodes 110. The bottom electrode contacts 112 are above and in electrical contact with the metal layer 102. Although two bottom electrodes 110 and two bottom electrode contacts 112 are shown, it should be appreciated that embodiments of the present invention may include any number of bottom electrodes 110 and two bottom electrode contacts 112.

Once the bottom electrodes 110 are formed, the second dielectric layer 114 is deposited on a top surface of the structure 100 using known deposition techniques, such as, for example, ALD, CVD, or PVD. The second dielectric layer 114 may be made of dielectric material, such as, for example, silicon nitride, to a thickness of about 50 nm.

With continued reference to FIG. 1, the heater 116 is formed within the second dielectric layer 114 above the bottom electrode 110 such that the bottom electrode 110 is below and in electrical contact with the heater 116. The heaters 116 are surrounded by the second dielectric layer 114. Although two heaters 116 shown, it should be appreciated that embodiments of the present invention may include any number of heaters 116. In an embodiment, each heater 116 includes an outer layer 118, a middle layer 120, and an inner layer 122. In an alternative embodiment, the heater 116 may be made of a single material such as, for example, the material that makes up the middle layer 120.

The heater 116 extends through the second dielectric layer 114 to the bottom electrode 110 and is formed within a trench. To remove the second dielectric layer 114 and form the heater 116, a resist, such as a photoresist, may be deposited and patterned. An etch process, such as a reactive ion etch (RIE), may be performed using the patterned resist as an etch mask to remove the second dielectric layer 114 until the bottom electrode 110 is exposed. The outer layer 118 may be conformally deposited within the trench, using deposition process such as for example, ALD, to a thickness of about 5 nm. The outer layer 118 may be made of material such as, for example, TaN. The middle layer 120 may be conformally deposited on top of the outer layer 118, within the trench, using deposition process, such as, for example, ALD, to a thickness of about 6 nm. The middle layer 120 may be made of material such as, for example, TiN. The inner layer 122 may be conformally deposited on top of the middle layer 120, filling the trench, using deposition process, such as, for example, ALD, to a thickness of about 20 nm. The middle layer 120 is between the outer layer 118 and the inner layer 122. The inner layer 122 may be made of material such as, for example, TaN. The inner layer 122 is surrounded by the middle layer 120. Once the heater 116 is formed, a CMP process may be used to remove excess portions of the outer layer 118, the middle layer 120, and the inner layer 122 remaining on top surfaces of the structure 100.

Referring now to FIG. 2, the structure 100 with a projection liner 124 is shown, in accordance with an embodiment. The projection liner 124 is deposited using deposition process such as for example, ALD, onto the top surface of the structure 100, covering the top surface of the heaters 116 and the second dielectric layer 114. The projection liner 124 may be made of semiconducting materials such as, for example, amorphous carbon or amorphous silicon. The projection liner 124 may also be made of a metal or a metal nitride, where the metal component may be a refractory material such as, for example, molybdenum, tungsten, titanium, tantalum, or the like. For example, the projection liner 124 may be made of TaN. The projection liner 124 enables current to pass from the bottom electrode 110 through a phase change material layer to a top electrode, bypassing an amorphous portion of the phase change material layer.

After the projection liner 124 is deposited onto the top surface of the structure 100, covering the top surface of the heaters 116 and the second dielectric layer 114, the projection liner 124 is then patterned (not shown). Patterning may be performed by lithography and etching. An etch process, such as, for example, a RIE process may be performed to remove certain portions of the projection liner 124. The resultant structure 100 includes portions of the projection liner 124 remaining directly above the heaters 116. The projection liner 124 laterally extends beyond the top surface of the heaters 116; however, the projection liner 124 does not laterally extend over the whole top surface of the second dielectric layer 114.

Referring now to FIG. 3, the structure 100 with a phase change material layer 126, a top electrode 128, and a mask layer 130 is shown, in accordance with an embodiment. The phase change material layer 126 may be deposited onto the top surface of the structure 100 using known deposition methods such as, ALD. The phase change material layer 126 may include both a crystalline phase 126a and an amorphous phase 126b. The amorphous phase 126b may be directly above the heater 116. The phase change material layer 126 may be formed from a class of materials preferably including chalcogenide based materials. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column six of the periodic table of elements, such as germanium (Ge) and tin (Sn). Often, chalcogenide alloys include combinations including one or more of antimony (Sb), gallium (Ga), indium (In), and silver (Ag).

Many phase change based memory materials have been described in technical literature, including alloys of Ga/Sb. In/Sb. In/Se, Sb/Te, Ge/Te, Ge/Sb/Te, In/Sb/Te, Ga/Se/Te, Sn/Sb/Te, In/Sb/Ge. Ag/In/Sb/Te, Ge/Sn/Sb/Te, Ge/Sb/Se/Te and Te/Ge/Sb/S. In the family of Ge/Sb/T alloys, a wide range of alloy compositions may be workable. The compositions can be characterized as $TeGe \cdot Sb_{100-(a+b)}$. More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties.

The top electrode 128 is deposited on top of the phase change material layer 126 to allow for the current to pass from the bottom electrodes 110 through the phase change material layer 126 to the top electrode 128. The top electrode 128 is above and in electrical contact with the phase change material layer 126. Known suitable deposition techniques, such as, for example, ALD, CVD, or PVD may be used to form the top electrode 128. The top electrode 128 is in direct contact with the phase change material layer 126. The top electrode 128 may be made from substantially the same conductive material as the bottom electrodes 110, such as, for example, TiN.

The mask layer 130 is deposited on top of the top electrode 128 using known deposition techniques. The mask layer 130 is in direct contact with the top electrode 128. The mask layer 130 may be made of a dielectric material such as, for example, silicon dioxide, silicon nitride, and/or silicon oxynitride. In some embodiments, the mask layer 130 can be formed utilizing a conventional deposition process such as, for example, CVD or PVD. The mask layer 130 is then patterned (not shown). Patterning may be performed by lithography and etching. An etch process, such as, for example, a RIE process may be performed to remove portions of the mask layer 130, the top electrode 128, and the phase change material layer 126. The resultant structure 100 includes portions of the first projection liner 124, the phase change material layer 126, the top electrode 128, and the mask layer 130 remaining directly above the heaters 116.

Referring now to FIG. 4, the structure 100 with a third dielectric layer 132, top electrode contacts 136, a via contact 138, a second NBLOK 140 and a second metal layer 142 is shown, in accordance with an embodiment. After the mask layer 130 is patterned, the third dielectric layer 132 is deposited onto the top surface of the structure 100 such that the third dielectric layer 132 covers a top surface of the mask layer 130 and the second dielectric layer 114. The third dielectric layer 132 may be made of any suitable dielectric material, such as, for example, silicon nitride, silicon based low-k dielectrics, or TEOS. Known suitable deposition techniques, such as, for example, ALD, CVD, or PVD may be used to form the third dielectric layer 132. The third dielectric layer 132 is made of materials that have low thermal conductivity. As a result, the third dielectric layer 132 function as an insulator. A planarization process, such as, for example, CMP, is done to remove excess material forming the third dielectric layer 132 from the top surface of the structure 100.

The structure 100 is patterned to create a via contact opening and top electrode contact openings (not shown). The top electrode contact openings extend from the top surface of the third dielectric layer 132 through the mask layer 130 to the top electrode 128. The top electrode contact openings vertically extend below the top surface of the phase change material layer 126. The via opening extends from the top surface of the third electric layer 132, through the second and first dielectric layers 114, 106, through the NBLOK 104, to the metal layer 102.

Once the openings are formed, a metal liner 134 is then conformally deposited, using known deposition techniques, within the top electrode openings. The metal liner 134 may be made of TaN, TiN, or any combination thereof. The openings are then filled with a conductive material such as, for example, copper tungsten, cobalt, or aluminum, forming the top electrode contacts 136. Having the metal liner 134 within the top electrode openings allows for the conductive material to be well formed within said openings.

The top electrode contacts 136 vertically extend down through the mask layer 130 and the top electrode 128 into the phase change material layer 126. As a result, portions of the top electrode contacts 136 wrap around the top portions of the phase change material layer 126. The top electrode contacts 136 are in electrical contact with the top electrode 128. The bottom portions of the top electrode contacts 136 form a ring around the mask layer 130, the top electrode 128, and the top portion of the phase change material layer 126.

Having the projection liner 124, in combination with the wrap around and ring type top electrode contacts 136, improves the resistance drift coefficient and reduces required programming current. Further, having the mask layer 130 on top of the top electrode 128 allows for heat to dissipate through the top electrode 128 and the phase change material layer 126. This in turn produces a longer thermal path that is more insulating and reduces the required programming currents. For example, during reading, a voltage may be applied to the bottom electrode 110 and the current may flow from the bottom electrode to the top electrode 128. The resistance of the first projection liner 124 is chosen such that the projection liner 124 has a marginal influence on the write operation (during which the phase transition occurs), but a significant influence on the read operation. This is indeed possible because electrical transport in the amorphous phase 126b is highly nonlinear. At high fields, the amorphous material undergoes the so-called electronic threshold switching, leading to a low-resistive state (ON state). Thus, if during the high-field write process the resistance of the projection liner 124 is significantly higher than the ON-state resistance of the amorphous phase 126b, most of the current will flow through the phase change material layer 126.

During the low-field read process, however, the current bypasses the highly resistive amorphous phase 126b and flows through that part of the first projection liner 124 that is parallel to it. Hence, the resistance of the device is dominated by the resistance of that part of the projection liner 124 and thus is a good measure of the amorphous/crystalline phase configuration. The information that typically is stored into the length of the amorphous phase 126b is in a sense projected onto the projection liner 124. Note that even though the projection liner 124 is present during both read and write operations, the 'projection' is designed to occur only during the read process. As such, the projection liner 124 provides a parallel conduction path in the crystalline phase 126a and the amorphous phase 126b of the phase change material layer 126. The projection liner 124 acts as parallel resistors that bypass current around the amorphous phase 126b.

With continued reference to FIG. 4, to form the via contact 138, the barrier layer 108 is first deposited within the via opening. The via openings is then filled with a conductive material such as, for example, copper tungsten, cobalt, or aluminum. A CMP may then be performed to remove excess material from a top surface of the structure 100. The via contact 138 is between and in electrical contact with the first metal layer 102 and the second metal layer 142.

After the top electrode contacts 136 and the via contact 138 are formed, the structure 100 may undergo further processing to form a second NBLOK 140 and a second metal layer 142. Using known deposition techniques, the second NBLOK 140 may be deposited onto the top surface of the structure 100. The second NBLOK 140 may be made of substantially the same material as the NBLOK 104. On top of the second NBLOK 140, the second metal layer 142 may be deposited, using known deposition techniques. The second metal layer 142 is made from substantially the same material as the first metal layer 102. A bottom surface of the second metal layer 142 is in direct contact with the top surface of the top electrode contacts 136 and the top surface of the via contact 138. The second metal layer 142 is then patterned and a fourth dielectric layer 144 is be deposited. The fourth dielectric layer 144 is made of substantially the same material as the first dielectric layer 106.

FIGS. 1-4 provide a method of fabricating a phase change memory cell with the first projection liner 124, the metal liner 134 and the wrap around ring type top electrode contacts 136. Having the wrap around ring type of top electrode contact 136, combined with the mask layer 130 on top of the top electrode 128, helps insulate the phase change memory cell better. This in turn may reduce programming current.

The phase change memory cell may be referred to as a mushroom type phase change memory cell due to the shape of the amorphous phase 126b of the phase change material layer 126. The resultant structure 100, as illustrated in FIG. 4, includes the first and the second projection liners 124, 134 and the wrap around ring type of top electrode contacts 136. The projection liner 124 separates the second dielectric layer 114 from the phase change material layer 126. The metal liner 134 is used to line the top electrode contact openings before the top electrode contact openings are filled to create the top electrode contacts 136. As a result, the metal liner 134 surrounds the top electrode contacts 136. Having the wrap around ring type of top electrode contacts 136 allows for the reading current run path to be adjusted. The adjustment may occur during the patterning of the top electrode contact openings. For example, the top electrode contact opening may be patterned so that it vertically extends further along the sidewalls of the phase change material layer 126 thereby reducing the gap between the projection liner 124 and the metal liner 134.

The projection liner 124 provides a parallel conduction path in the crystalline phase 126a and the amorphous phase 126b of the phase change material layer 126 thereby mitigating resistance drift coefficient during current reading. The projection liner 124 acts as parallel resistors that bypasses current around the amorphous phase 126b. Since the amorphous phase 126b of the phase change material layer 126 experiences resistance drift, the amorphous phase 126b is the dominant resistor. The projection liner 124 provides an alternative current path under the amorphous phase 126b. The resistance from the current going along the projection liner 124 provides the read RESET resistance of the phase change memory cell. Further, the combination of the projection liner 124 and the wrap around ring type of top electrode contact 136 allows for the current to more easily travel through the projection liner 124, through the crystalline phase 126a, to the top electrode contact 136.

Figure 5:
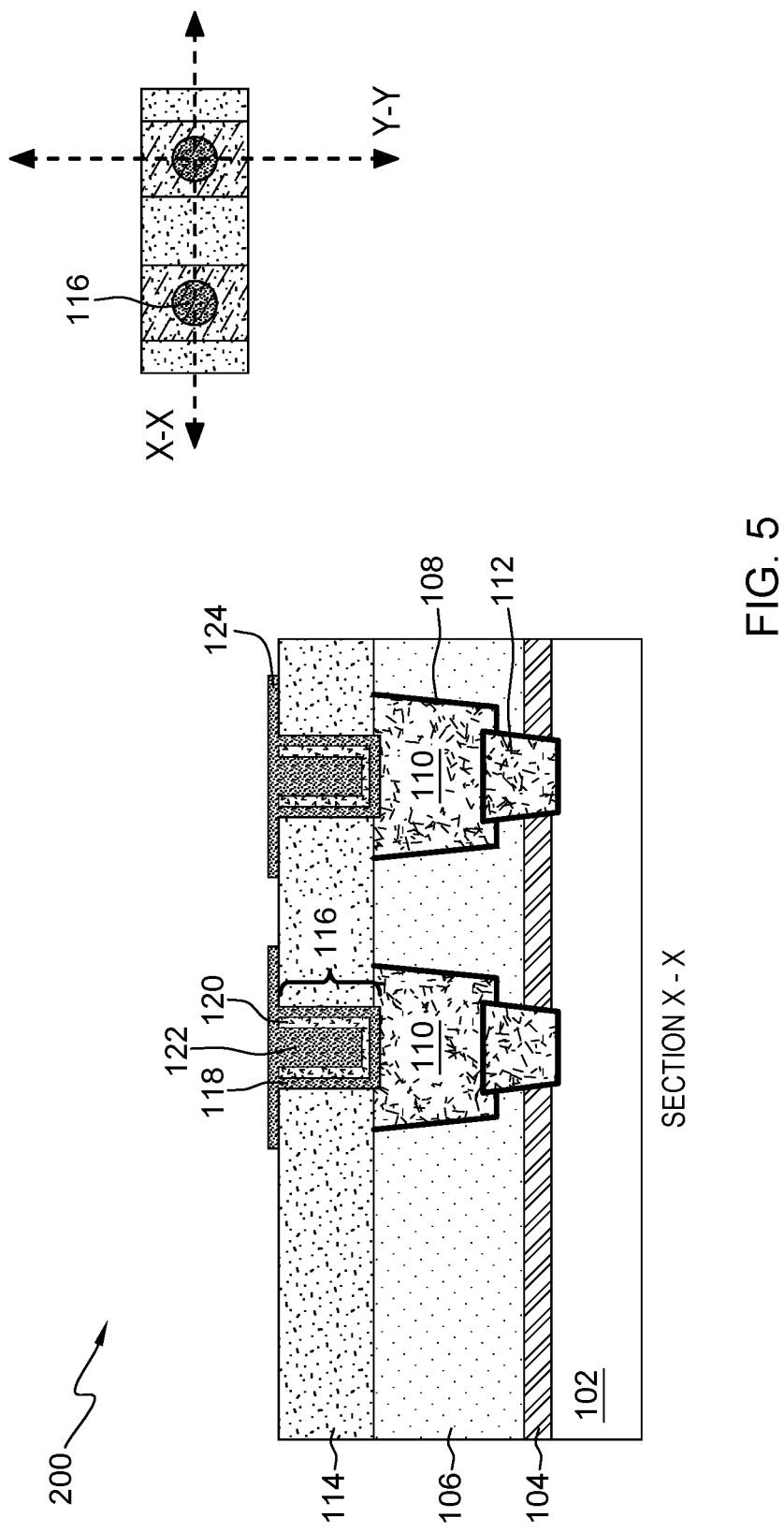
FIG. 5 is a cross section view illustrating the projection liner above the heaters according to an exemplary embodiment.
Figure 6:
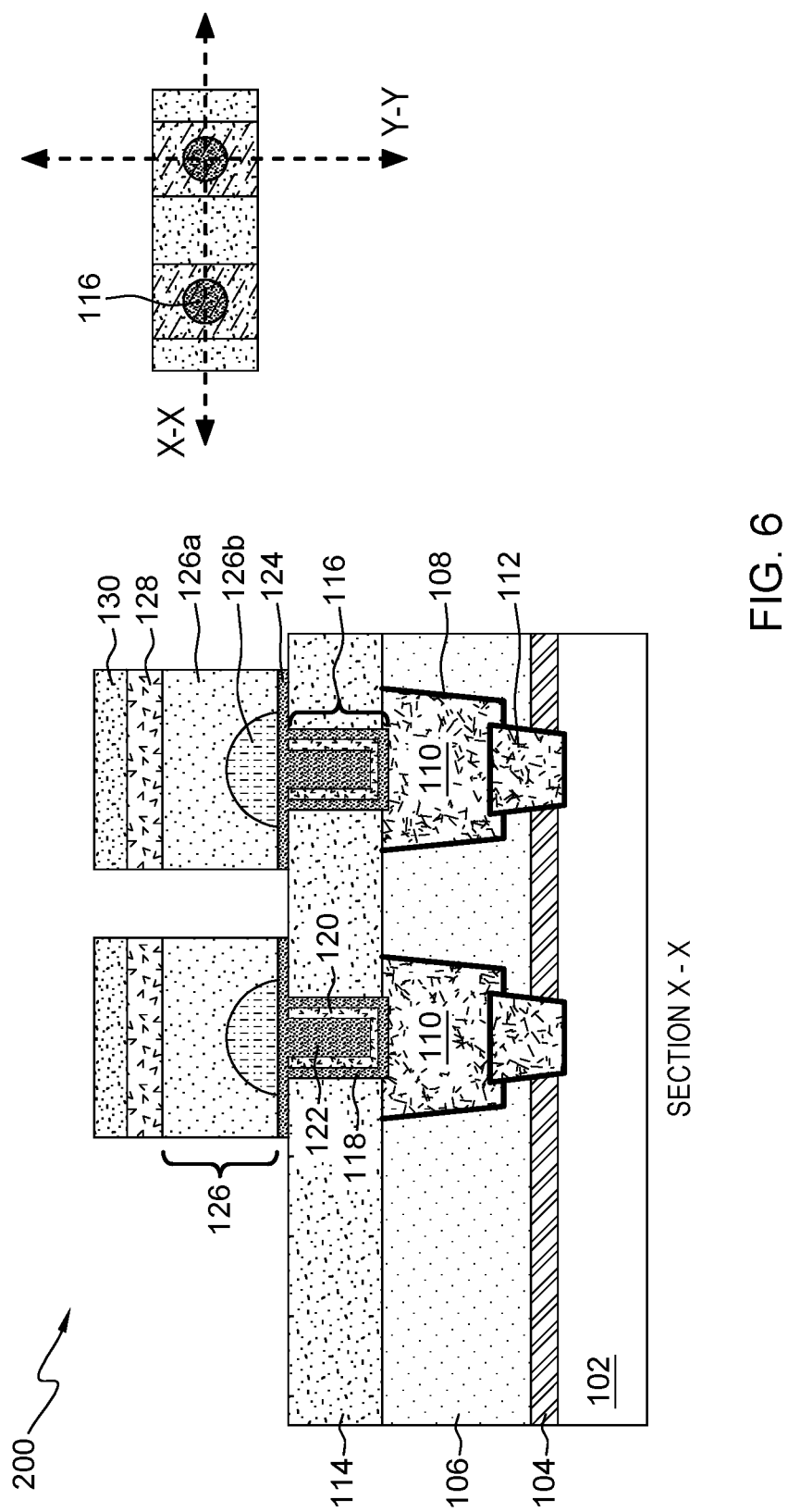
FIG. 6 is a cross section view illustrating the phase change material layer, the top electrode, and the mask layer above the heaters according to an exemplary embodiment.
Figure 7:
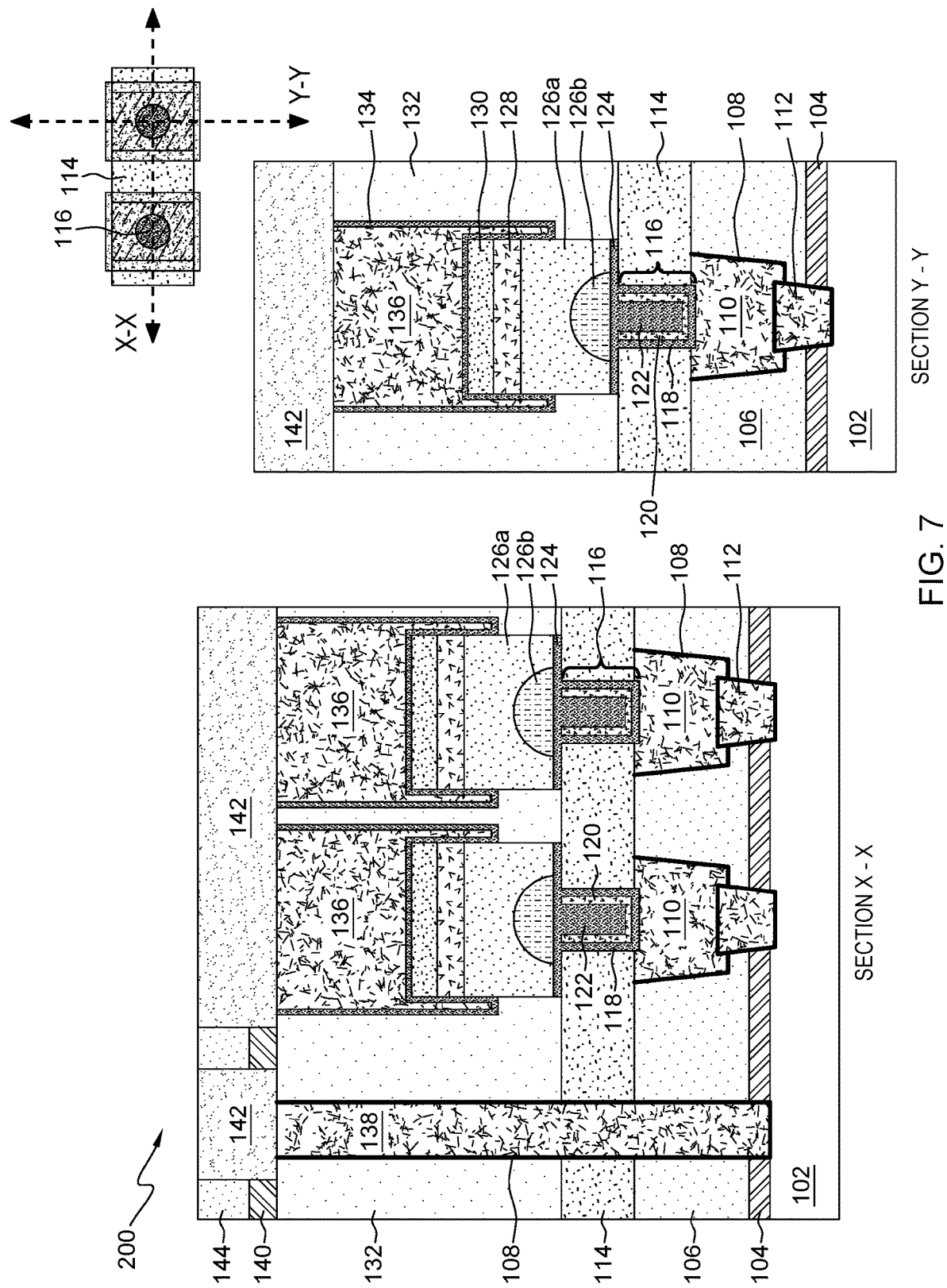
FIG. 7 is a cross section view, along sections X-X and Y-Y, illustrating top electrode contacts with the metal liner and the via contact according to an exemplary embodiment.

Another embodiment by which to fabricate a phase change memory cell with the first projection liner 124 and the wrap around ring type of top electrode contacts 136 is described in detail below by referring to the accompanying FIGS. 5-7. FIGS. 5-6 are cross section views taken along section line X-X. FIG. 7 is a cross section view taken along section line X-X and section Y-Y. In the present embodiment, the phase change material layer 126 is separated above the heaters 116.

Referring now to FIG. 5, a structure 200 is shown at an intermediate state of fabrication after the heater formation (as described above with respect to FIG. 1), in accordance with an embodiment of the present invention. The structure 200 may be substantially similar in all respects to the structure 100 described in detail above with respect to FIG. 1; however, in the present embodiment, the structure 200 includes two separate portions of the projection liner 124.

Beginning with the structure 100 of FIG. 1, the projection liner 124 is deposited using deposition process such as for example, ALD, onto the top surface of the structure 100, covering the top surface of the heaters 116 and the second dielectric layer 114. The projection liner 124 is then patterned (not shown). Patterning may be performed by lithography and etching. An etch process, such as, for example, a RIE process may be performed to remove certain portions of the projection liner 124 from the top surface of the second dielectric layer 114 that does not have heaters 116 directly below it. Further, portions of the projection liner 124 are also removed from the top surface of the second dielectric layer 114 that is located between the heaters 116. As a result, portions the projection liner 124 extends over the top surface of the heaters 116 and the top surface of the second dielectric layer 114 that surrounds the heaters 116.

Referring now to FIG. 6, the structure 200 with the phase change material layers 126, the top electrodes 128, and the mask layers 130 is shown, in accordance with an embodiment. The phase change material layer 126 is first deposited onto the top surface of the structure 200. The top electrode 128 is then deposited on top of the phase change material layer 126, followed by the deposition of the mask layer 130 on top of the top electrode 128. The phase change material layer 126, the top electrode 128, and the mask layer 130 may be deposited using known deposition techniques such as, for example, CVD, PVD, or ALD.

After it is deposited, the mask layer 130 is patterned (not shown). Patterning may be performed by lithography and etching. An etch process such as, for example, a RIE process may be performed to remove portions of the mask layer 130, the top electrode 128, and the phase change material layer 126, thereby exposing the top surface of the second dielectric layer 114 between the heaters 116.

Removing portions of the mask layer 130, the top electrode 128, and the phase change material layer 126 between the heaters 116 creates an opening that extends from the top surface of the mask layer 130, through the top electrode 128 and the phase change material layer 126, to the exposed top surface of the second dielectric layer 114. Portions of the mask layer 130, the top electrode 128, and the phase change material layer 126 are also removed from sections of the structure 200 that does not include the heaters 116 within the second dielectric layer 114. The resultant structure 200, illustrated in FIG. 6, includes two heaters 116 with two phase change memory cells. As a result, the heating of one heater 116, for example the heater 116 on the left, may not have an effect on the phase change memory layer 126 above the second heater 116, for example the heater 116 on the right.

Referring now to FIG. 7, the structure 200 undergoes additional processing that is described in detail with reference to FIG. 4. The resultant structure, illustrated in FIG. 7, is substantially the same as the resultant structure 100, illustrated in FIG. 4, since both structures include the projection liner 124. The projection liner 12 is self-aligned. The projection liner 124 in both structures 100, 200 laterally extends above the heaters 116, separating the top surface of the heaters 116 and the top surface of the surrounding second dielectric layer 114 from the bottom surface of the phase change material layer 126. The metal liner 134 in both structures 100, 200 surrounds the top electrode contact 136, separating the top electrode contact 136 from the phase change material layer 126, the top electrode 128, and the mask layer 130.

The structure 200, illustrated in FIG. 7, includes two phase change memory cells separated by the third dielectric layer 132. Each of the two phase change memory cells includes the bottom electrode 110, the heater 116, the phase change material layer 126, and the top electrode 128. The structure 200 also includes two top electrode contacts 136. Each top electrode contact 136 is a ring type of an electrode contact that wraps around the mask layer 130, the top electrode 128, and top portions of the phase change material layer 126. The top electrode contacts 136 extend vertically along sidewall portions of the mask layer 130, the top electrode 128, and the phase change material layer 126.

Embodiments of the present invention described above illustrate a method and structure of forming a phase change memory cell that includes the projection liner 124 with a wrap around and ring type of top electrode contact 136. The combination of the projection liner 124 with the wrap around and ring type of top electrode contact 136 mitigates resistance drift by providing a current path from the bottom electrode 110 to the top electrode 128, bypassing the amorphous phase 126b of the phase change material layer 126. This may improve the resistance drift coefficient from a range of about 0.005-0.01 to a range of about 0.001-0.005. Further, having a wrap around and ring type of top electrode contact 136 provides a thermal benefit to the phase change memory cell and may lower the phase change memory cell's programming current.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A structure comprising:
a heater surrounded by a dielectric layer;
a projection liner on top of the heater, the projection liner covers a top surface of the heater;
a phase change material layer above the projection liner, the projection liner separates the phase change material layer from the second dielectric layer and the heater; and
a top electrode contact surrounding a top portion of the phase change material layer, the top electrode contact separated from the phase change material layer by a metal liner.

2. The structure of claim 1, further comprising:
a bottom electrode below and in electrical contact with the heater; and
a top electrode above and in electrical contact with the phase change material layer.

3. The structure of claim 2, further comprising:
a mask layer above and in direct contact with the top electrode; and
a bottom electrode contact below and in electrical contact with the bottom electrode.

4. The structure of claim 1, wherein the phase change material layer includes a crystalline phase and an amorphous phase, wherein the amorphous phase is directly above the heater.

5. The structure of claim 4, wherein the projection liner provides a parallel conduction path in the crystalline phase and the amorphous phase of the phase change material layer.

6. The structure of claim 1, wherein the top electrode contact is a wrap-around ring type of top electrode contact.

7. The structure of claim 1, wherein the top electrode contact vertically extends along the sidewalls of the phase change material layer.

8. A structure comprising:
two or more phase change memory cells separated by a dielectric layer, each of the two or more phase change memory cells comprises a phase change material layer and a heater; and
two or more top electrode contacts on top of the two or more phase change memory cells, the two or more top electrode contacts are separated from the phase change memory cells by a metal liner, the two or more top electrode contacts extend vertically along sidewall portions of the phase change material layer.

9. The structure of claim 8, wherein the phase change material layer includes a crystalline phase and an amorphous phase, wherein the amorphous phase is directly above the heater.

10. The structure of claim 8, wherein each of the two or more phase change memory cells comprises:
the heater surrounded by a second dielectric layer;
a projection liner on top of the heater, the projection liner covers a top surface of the heater;
the phase change material layer above the projection liner, the projection liner separates the phase change material layer from the second dielectric layer and the heater;
a bottom electrode below and in electrical contact with the heater; and
a top electrode above and in electrical contact with the phase change material layer.

11. The structure of claim 9, further comprising:
a mask layer above and in direct contact with the top electrode; and
a bottom electrode contact below and in electrical contact with the bottom electrode.

12. The structure of claim 10, further comprising:
a first metal layer below and in electrical contact with the bottom electrode contact;
a second metal layer above and in electrical contact with the top electrode contact; and a via contact between and in electrical contact with the first metal layer and the second metal layer.

13. The structure of claim 10, wherein the projection liner provides a parallel conduction path in the crystalline phase and the amorphous phase of the phase change material layer.

14. The structure of claim 9, wherein the two or more top electrode contacts are wrap-around ring type top electrode contacts.

15. A method comprising:
forming a heater surrounded by a second dielectric layer;
depositing a projection liner on top of the heater, the projection liner covers a top surface of the heater;
depositing a phase change material layer above the projection liner, the projection liner separates the phase change material layer from the second dielectric layer and the heater; and
forming a top electrode contact surrounding a top portion of the phase change material layer, the top electrode contact separated from the phase change material layer by a metal liner.

16. The method of claim 15, further comprising:
forming a bottom electrode below and in electrical contact with the heater; and
depositing a top electrode above and in electrical contact with the phase change material layer.

17. The method of claim 16, further comprising:
depositing a mask layer above and in direct contact with the top electrode; and
forming a bottom electrode contact below and in electrical contact with the bottom electrode.

18. The method of claim 15, wherein the phase change material layer includes a crystalline phase and an amorphous phase, wherein the amorphous phase is directly above the heater.

19. The method of claim 18, wherein the projection liner provides a parallel conduction path in the crystalline phase and the amorphous phase of the phase change material layer.

20. The method of claim 15, wherein the top electrode contact is a wrap-around ring type of top electrode contact that vertically extends along the sidewalls of the phase change material layer.

* * * * *